United States Patent
Sultenfuss et al.

(10) Patent No.: US 7,421,591 B2
(45) Date of Patent: Sep. 2, 2008

(54) DATA FLOW CONTROL SYSTEM AND METHOD FOR CONSERVING POWER IN A POWER MANAGED SYSTEM

(75) Inventors: Andrew T. Sultenfuss, Leander, TX (US); Jonathan Foster Lewis, Pflugerville, TX (US)

(73) Assignee: Dell Products L.P., Round Rock, TX (US)

( * ) Notice: Subject to any disclaimer, the term of this patent is extended or adjusted under 35 U.S.C. 154(b) by 304 days.

(21) Appl. No.: 10/651,946

(22) Filed: Aug. 29, 2003

(65) Prior Publication Data

US 2005/0057954 A1 Mar. 17, 2005

(51) Int. Cl.
G06F 1/32 (2006.01)
G11C 11/21 (2006.01)

(52) U.S. Cl. .............. 713/300; 713/310; 713/320; 713/323; 713/324; 365/129

(58) Field of Classification Search .......... 713/300, 713/310, 320–324, 330, 340; 365/129
See application file for complete search history.

(56) References Cited

U.S. PATENT DOCUMENTS

| | | | | |
|---|---|---|---|---|
| 5,734,927 A | * | 3/1998 | Boutaud et al. | 710/60 |
| 5,799,256 A | | 8/1998 | Pombo et al. | |
| 5,884,088 A | * | 3/1999 | Kardach et al. | 713/324 |
| 5,940,447 A | | 8/1999 | Connell et al. | |
| 6,389,556 B1 | * | 5/2002 | Qureshi | 714/15 |
| 6,795,450 B1 | * | 9/2004 | Mills et al. | 370/463 |
| 7,047,428 B2 | * | 5/2006 | Bui | 713/320 |
| 2002/0082060 A1 | | 6/2002 | Kang et al. | |
| 2002/0094840 A1 | | 7/2002 | Hattoria et al. | |
| 2002/0115481 A1 | * | 8/2002 | Saito | 455/574 |
| 2003/0147364 A1 | | 8/2003 | Watanabe et al. | |
| 2004/0128577 A1 | * | 7/2004 | Silvester | 713/324 |

FOREIGN PATENT DOCUMENTS

| | | |
|---|---|---|
| EP | 1223680 A2 | 9/2001 |
| WO | 98/09411 | 8/1997 |
| WO | 00/13443 | 8/1999 |
| WO | 02/69655 A2 | 2/2002 |
| WO | 02/33989 A2 | 4/2002 |

* cited by examiner

*Primary Examiner*—Nitin C. Patel
*Assistant Examiner*—Fahmida Rahman
(74) *Attorney, Agent, or Firm*—Baker Botts L.L.P.

(57) ABSTRACT

A system and method for conserving power in a power managed information handling system are provided. While the host unit or central processing unit of the information handling system is in a reduced power state, the communication controller maintains received data in an associated buffer. The communication controller releases all or a portion of the buffered data during time intervals in which the host unit is in a normal operating mode. By buffering and releasing data in coordination with the reduced power state and normal operating state, respectively, of the host unit, power conservation in the information handling system may be enhanced by not causing the host unit to return to normal operation prematurely.

20 Claims, 3 Drawing Sheets

DATA FLOW CONTROL SYSTEM AND METHOD FOR CONSERVING POWER IN A POWER MANAGED SYSTEM

TECHNICAL FIELD

The present disclosure relates generally to information handling systems and, more particularly, to a method and system for enhancing power conservation in a portable information handling system environment.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

In the world of desktop information handling systems, the name of the game has generally been to create desktop systems with more power and more performance. However, in the world of portable information handling systems the name of the game generally remains power management.

Many portable system devices or components are smaller, derivative versions of their desktop system counterparts. As such, design goals and priority conflicts between the two versions abound. An exquisite example where the power and performance design mentality of the desktop system conflicts with the power management mentality of the portable system is in the area of system communications and, in particular, networking.

First, many network distribution devices, e.g., servers, are typically designed to distribute information as quickly as possible. As a result, systems connected to the network may at any instant received data, whether or not requested. Consequently, the communications hardware of systems coupled to the network must typically be at the communication ready, particularly to receive unsolicited information. Therefore, communication hardware must generally always be powered and available to receive information.

Being developed first in the desktop environment, most communications hardware, e.g., Ethernet controllers, is designed to continually have power such that it may maintain a link with the network and receive requested and/or unsolicited information whenever transmitted. Also as a result of originating in the desktop environment where operating power is generally unlimited in supply, i.e., most desktop systems are powered by fixed A/C sources, such communication controllers typically proceed immediately to processing any received information. In the case of requested information, immediate processing is likely the preferred mentality. However, for unsolicited information, the need for immediate processing is seldom mandatory. The costs to the portable system of migrating communication hardware designed with desktop operating characteristics are significant in light of the portable system design's power management focus.

Portable system power management is in many respects effected by letting the portable system rest whenever possible. In resting the portable system, one or more of a plurality of system components may be reduced in operation so as not to consume battery power or to consume as little power as necessary without significantly compromising the user's experience. Hence, the power management directive of portable system design directly conflicts with the power and performance maximizing mentality of those desktop devices that have migrated to the portable environment. As a result, while many of the portable system's components are attempting to maximize battery life by resting whenever possible, their modified desktop counterparts often prevent or shorten such rest periods through their pursuit of immediate processing in accordance with their desktop design mentality.

SUMMARY

In accordance with teachings of the present disclosure, a method for conserving power in an information handling system is described. The method preferably includes receiving data by a communication controller of the information handling system. The method preferably also includes maintaining data in a buffer associated with the communication controller during selected intervals where the intervals selected for maintaining data correspond to intervals during which a host unit of the information handling system is in a reduced power state. Further, the method preferably also includes releasing the data from the buffer for processing at selected intervals where the intervals selected for data release correspond to intervals during which the host unit of the information handling system is in a normal power state.

In addition, teachings of the present disclosure provide a method for reducing power consumption in an information handling system. The method preferably includes quieting one or more data buses coupled to an information handling system host unit and thereupon migrating the host unit to a reduced power state. Further, the method preferably also includes maintaining the host unit in the reduced power state and the one or more data buses quiet for a selected period of time and, thereafter, resuming operation of the information handling system in accordance with a user selected operating mode.

Teachings of the present disclosure also provide an information handling system having a host unit, a data bus operably coupled to the host unit and a communication controller operably coupled to the data bus and the host unit. The communication controller preferably includes a memory and is operable to receive a volume of data, hold the received data in memory while the host unit is in a state of reduced operation and release the data for processing while the host unit is in a state of normal operation.

In one aspect, the present disclosure provides the technical advantage of reducing power consumption in an information handling system without significantly impacting the user experience.

In another aspect, the present disclosure provides the technical advantage of extending battery life in a portable information handling system by maximizing the time components spend in a reduced power state.

In a further aspect, the present disclosure provides the technical advantage of pausing data processing so as to maximize information handling system power savings while ensuring both that data loss is minimized and that priority data receives appropriate attention.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1 through 4, wherein like numbers are used to indicate like and corresponding parts.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
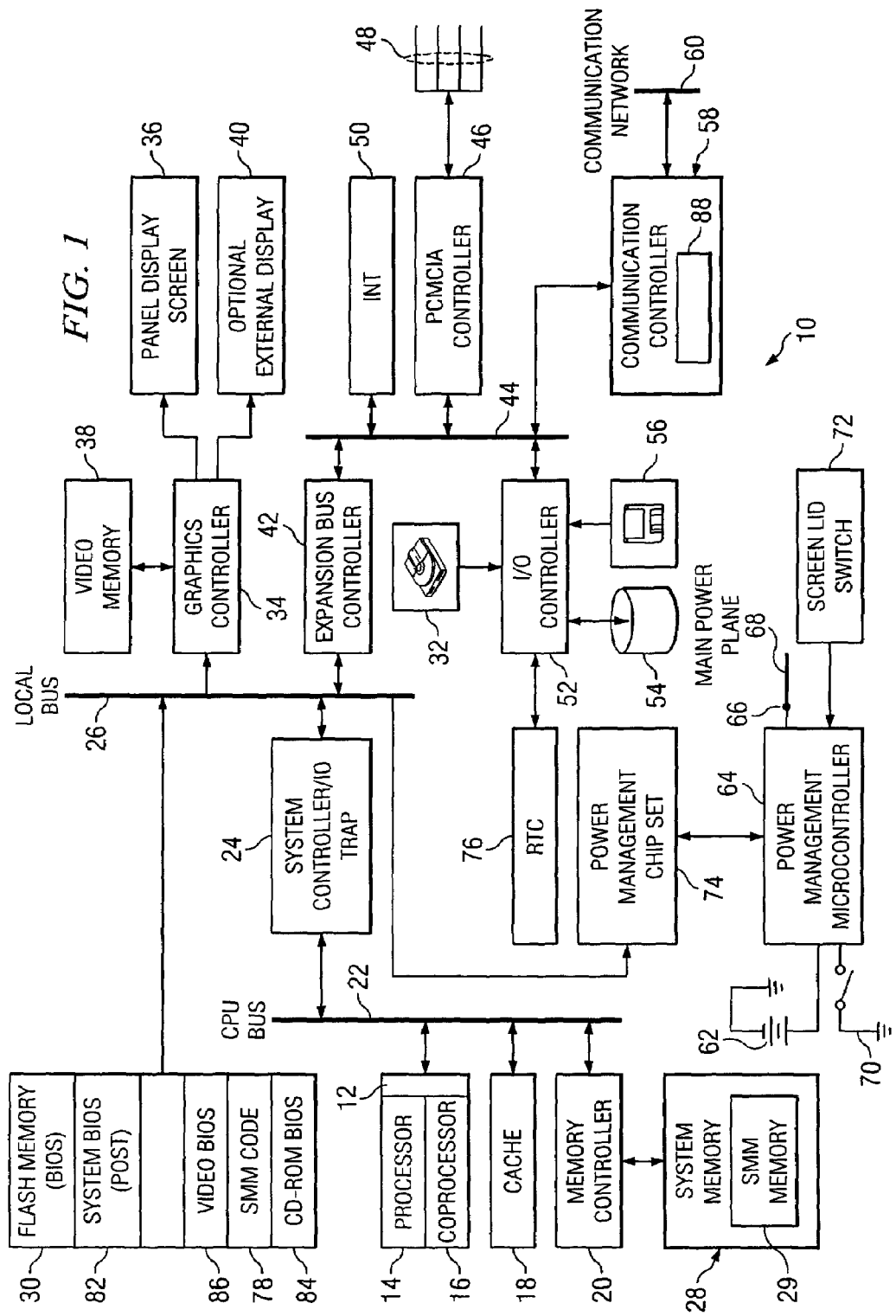
FIG. 1 is a block diagram depicting an embodiment of a portable information handling system incorporating teachings of the present disclosure.

Referring first to FIG. 1, a block diagram of an information handling system is shown, according to teachings of the present invention. Information handling system or computer system 10 preferably includes at least one microprocessor or central processing unit (CPU) 12. CPU 12 may include processor 14 for handling integer operations and coprocessor 16 for handling floating point operations. CPU 12 is preferably coupled to cache 18 and memory controller 20 via CPU bus 22. System controller I/O trap 24 preferably couples CPU bus 22 to local bus 26 and may be generally characterized as part of a system controller.

Main memory 28 of dynamic random access memory (DRAM) modules is preferably coupled to CPU bus 22 by a memory controller 20. Main memory 28 may be divided into one or more areas such as system management mode (SMM) memory area 29.

Basic input/output system (BIOS) memory 30 is also preferably coupled to local bus 26. FLASH memory or other nonvolatile memory may be used as BIOS memory 30. A BIOS program (not expressly shown) is typically stored in BIOS memory 30. The BIOS program preferably includes software which facilitates interaction with and between information handling system 10 boot devices such as a keyboard (not expressly shown), a mouse (not expressly shown), or CD-ROM 32. BIOS memory 30 may also store system code operable to control a plurality of basic information handling system 10 operations.

Graphics controller 34 is preferably coupled to local bus 26 and to panel display screen 36. Graphics controller 34 may also be coupled to video memory 38 operable to store information to be displayed on panel display 36. Panel display 36 is typically an active matrix or passive matrix liquid crystal display (LCD), however, other display technologies may be employed. In selected applications, uses or instances, graphics controller 34 may also be coupled to an optional, external display or standalone monitor display 40.

Bus interface controller or expansion bus controller 42 preferably couples local bus 26 to expansion bus 44. In one embodiment, expansion bus 44 may be configured as an Industry Standard Architecture ("ISA") bus. Other buses, for example, a Peripheral Component Interconnect ("PCI") bus, may also be used.

Personal computer memory card international association (PCMCIA) controller 46 may also be coupled to expansion bus 44 as shown. PCMCIA controller 46 is preferably coupled to a plurality of expansion slots 48. Expansion slots 48 may be configured to receive PCMCIA expansion cards such as modems, fax cards, communications cards, and other input/output (I/O) devices.

Interrupt request generator 50 is also preferably coupled to expansion bus 44. Interrupt request generator 50 is preferably operable to issue an interrupt service request over a predetermined interrupt request line in response to receipt of a request to issue interrupt instruction from CPU 12.

I/O controller 52, often referred to as a super I/O controller, is also preferably coupled to expansion bus 44. I/O controller 52 preferably interfaces to integrated drive electronics (IDE) hard drive 54, CD-ROM (compact disk-read only memory) drive 32 and floppy disk drive 56. Other disk drive devices (not expressly shown) which may be interfaced to the I/O controller include a removable hard drive, a zip drive, a CD-RW (compact disk-read/write) drive, and a CD-DVD (compact disk—digital versatile disk) drive.

Communication controller 58 is preferably provided and enables information handling system 10 to communicate with communication network 60, e.g., an Ethernet network. Communication network 60 may include a local area network (LAN), wide area network (WAN), Internet, Intranet, wireless broadband or the like. Communication controller 58 may be employed to form a network interface for communicating with other information handling systems (not expressly shown) coupled to communication network 60. An information handling system's communication components generally include hardware as well as software components. Examples of hardware components include communication controller 58 and communication network 60. Examples of software components include messaging services and network administration services.

As illustrated, information handling system 10 preferably includes power supply 62, which provides power to the many components and/or devices that form information handling system 10. Power supply 62 may be a rechargeable battery, such as a nickel metal hydride ("NiMH") or lithium ion battery, when information handling system 10 is embodied as a portable or notebook computer.

Power supply 62 is preferably coupled to power management microcontroller 64. Power management microcontroller 64 preferably controls the distribution of power from power supply 62. More specifically, power management microcontroller 64 preferably includes power output 66 coupled to main power plane 68 which supplies power to CPU 12. Power management microcontroller 64 may also be coupled to a power plane (not expressly shown) operable to supply power to panel display 36.

Power management microcontroller 64 preferably monitors the charge level of power supply 62 to determine when and when not to charge battery 62. Power management microcontroller 64 is preferably also coupled to main power switch 70, which the user actuates to turn information handling system 10 on and off. While power management microcontroller 64 powers down one or more portions or components of information handling system 10, e.g., CPU 12, panel display 36, or hard drive 54, when not in use to conserve power, power management microcontroller 64 itself is preferably substantially always coupled to a source of power, preferably power supply 62.

In a portable embodiment, information handling system 10 may also include screen lid switch 72 or indicator 72 which provides an indication of when panel display 36 is in an open position and an indication of when panel display 36 is in a closed position. It is noted that panel display 36 may be located in the same location in the lid (not expressly shown) of the computer as is typical for clamshell configurations of portable computers such as laptop or notebook computers. In this manner, panel display screen 36 may form an integral part of the lid of the system, which swings from an open position to permit user interaction to a closed position.

Computer system 10 may also include power management chip set 74. Power management chip set 74 is preferably coupled to CPU 12 via local bus 26 so that power management chip set 74 may receive power management and control commands from CPU 12. Power management chip set 74 is preferably connected to a plurality of individual power planes (not expressly shown) operable to supply power to respective components of information handling system 10, e.g., hard drive 54, floppy drive 56, etc. In this manner, power management chip set 74 preferably acts under the direction of CPU 12 to control the power supplied to the various power planes and components of a system.

Real-time clock (RTC) 76 may also be coupled to I/O controller 52 and power management chip set 74. Inclusion of RTC 76 permits timed events or alarms to be transmitted to power management chip set 74. Real-time clock 76 may be programmed to generate an alarm signal at a predetermined time as well as to perform other operations.

When information handling system 10 is turned on or powered up, information handling system 10 preferably enters a start up phase, also referred to as a boot up phase, during which the available computer system hardware may be detected and the operating system loaded. During the initial boot stage, BIOS software stored in non-volatile BIOS memory 30 may be copied into main memory 28 to provide for quick execution. This technique may be referred to as shadowing or shadow RAM. At this time, SMM code 78 may be copied into the system management mode memory area 29 of main memory 28. CPU 12 preferably executes SMM code 78 after CPU 12 receives a system management interrupt (SMI) which causes the microprocessor to enter SMM. It is noted that along with SMM code 78, also preferably stored in BIOS memory 30 and copied into main memory 28 at power up are system BIOS 82, including a power on self test module (POST), CD-ROM BIOS 84 and video BIOS 86. Alternative memory mapping schemes may also be used. For example, SMM code 78 may be stored in a fast SRAM memory (not expressly shown) coupled to CPU bus 22.

As mentioned above, accompanying the operation of CPU 12 are one or more power management features. Such power management features may be implemented in software, in hardware such as CPU 12, power management chip set 74, power management microcontroller 64 or elsewhere in information handling system 10. In a preferred embodiment, these power management features may affect the operation of an information handling system 10 test unit as well as other devices and/or components of information handling system 10. In one embodiment, a host unit may include at least CPU 12. However, other embodiments of a host unit may include CPU 12 as well as other information handling system 10 components or the host unit may include components exclusive of CPU 12.

At a minimum, the power management features of information handling system 10 at least enable CPU 12 to enter one or more states of reduced operation, commonly referred to as C-states C-1, C-2, C-3, and C-4. The manner in which one or more power management features of information handling system 10 react may be determined by one or more user preference settings, by one or more information handling system limitations or settings, as well as by other means.

Depending on the C-state entered into, the level of resultant power savings and activity of the various components or devices of information handling system 10 may vary. In a portable information handling system 10 environment, the greatest power savings typically arise from the system's utilization of the C-3 and C-4 reduced power states. However, for purposes of user interactivity, the C-3 reduced power state is significant because user context is preserved when the host unit enters the C-3 state. In other words, typical entrance into and exit from the C-3 state is generally not noticeable by the user as the status of information, windows, programs, etc., is typically the same both before entering the C-3 state and after emerging from the C-3 state. In the C-4 state, by contrast, some information may be flushed to permit the system or host unit to go into a further reduced power state. While the C-4 state, the other existing C-states or future reduced power states may be employed with teachings of the present disclosure, reference herein will be made primarily to the C-3 reduced power state for purposes of description only. Such reference is not intended to limit teachings of the present disclosure.

Figure 2:
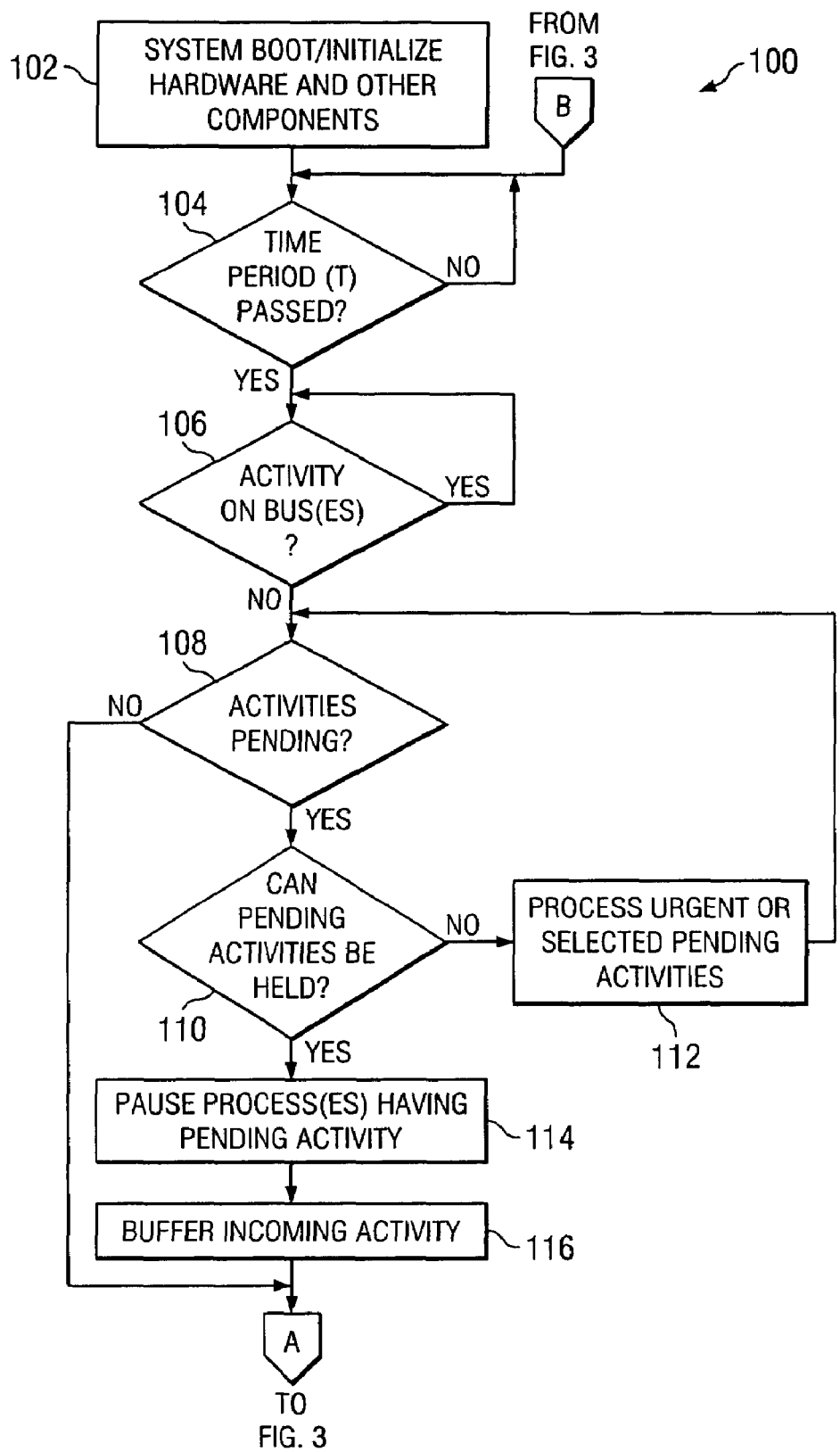
FIGS. 2 and 3 are flow diagrams depicting one embodiment of data flow control method for conserving power in a power managed information handling system incorporating teachings of the present disclosure.
Figure 3:
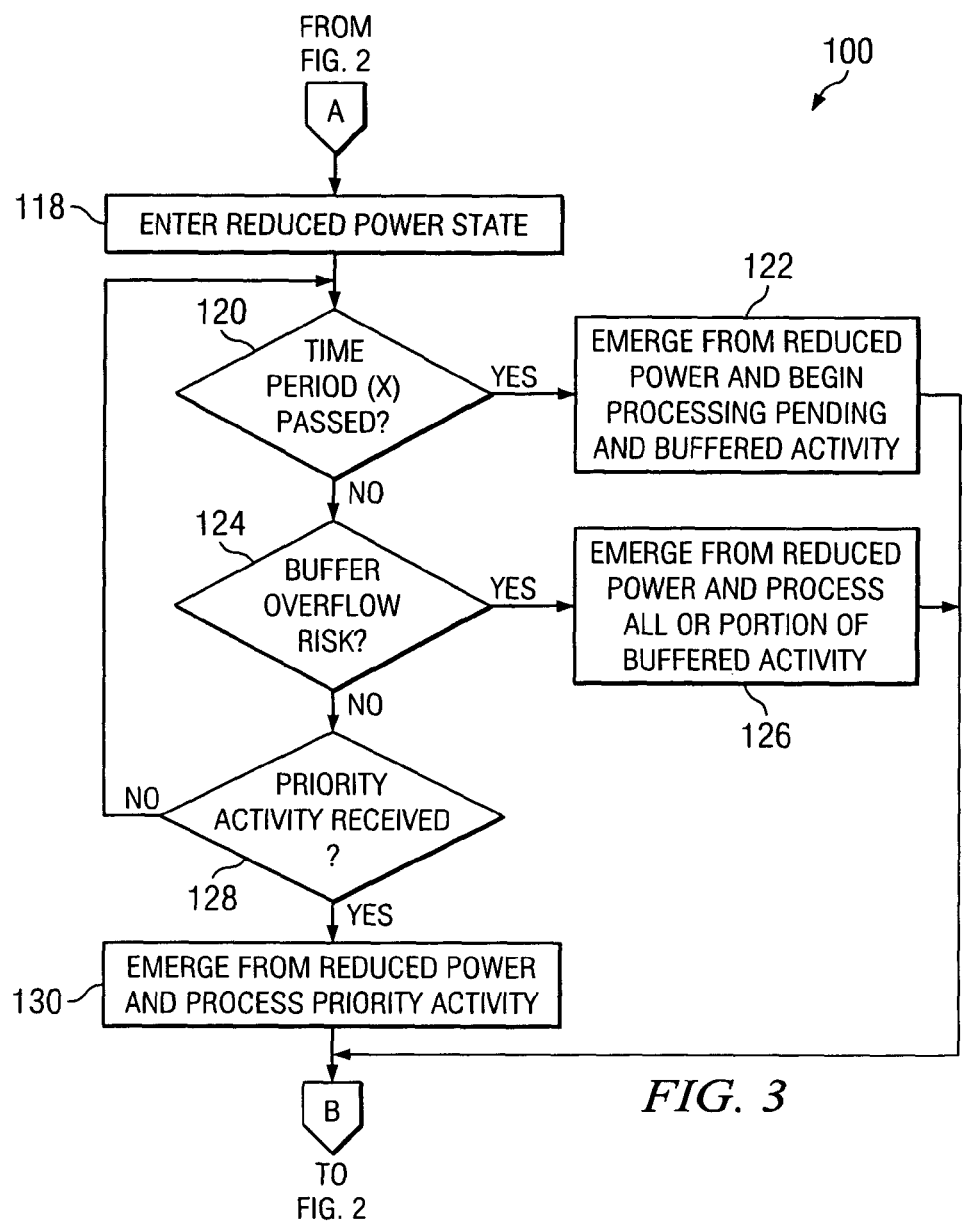

In one aspect, the method of FIGS. 2 and 3 provides for the quieting of one or more data buses of information handling system 10, e.g., CPU bus 22, local bus 26 and expansion bus 44. The cessation of activity or quieting on the one or more data buses is significant in that one or more components of information handling system 10 may not be permitted to proceed to a reduced power state if there is activity on one or more of the data buses.

As many of the desktop components that have been migrated into the portable system environment were not designed to take into account the need for periods of bus inactivity and reduced power, they often prevent or interrupt periods of inactivity and, therefore, reduced power hindering information handling system 10 rest and negating power conservation efforts. Consequently, to overcome the conflicts flowing from the migration of desktop components into portable systems, a compromise must be made between the power management goals of the portable system mentality and the power and performance goals of the desktop mentality. One such compromise may be illustrated by the method of FIG. 2 and FIG. 3.

Referring now to FIGS. 2 and 3, a method for reducing power consumption in an information handling system is shown according to teachings of the present disclosure. According to one implementation, method 100 preferably begins at 102, during system boot or hardware initialization of information handling system 10. As mentioned above, teachings of the present disclosure may be implemented in one or more hardware or software components of information handling system 10. As such, the preferred initialization point for method 100 may depend on the implementation chosen.

Once initialized, method 100 preferably monitors information handling system 10 performance to identify periods during which one or more information handling system 10 components or devices may be rested or placed in a reduced power state.

As mentioned above, information handling system 10 will typically not proceed to a reduced power state unless the one or more data buses 22, 26 and 44 are free from activity. In an alternative implementation, information handling system 10 may also require that enough free or quiescent time be available before permitting migration to a reduced power state. For example, if it is determined that information handling system 10 will not be able to remain in a reduced power state for at least a minimum period of time, e.g., because of impending transaction processing or other system activity, information handling system 10 may refuse to enter a reduced power state until there is both enough system down time available and there is no activity on the one or more buses 22, 26 and 44.

As illustrated in FIGS. 2 and 3, method 100 may check the operating status of information handling system 10 and one or more of its data buses 22, 26 and 44 at selected time intervals. As such, after initialization at 102, method 100 preferably proceeds to 104 where passage of a time interval (T) may be awaited. For purposes of the present description, time interval (T) may be defined as the time interval between reduced power states, e.g., the time between CPU 12 C-3 states. During time interval (T), method 100 preferably loops or waits while information handling system 10 operates normally, e.g., not subject to instructions associated with method 100. Upon passage of time interval (T), e.g., one hundred twenty microseconds (120 μs), one hundred sixty microseconds (160 μs), one hundred eighty microseconds (180 μs), etc., method 100 preferably proceeds to 106.

At 106, method 100 preferably checks the one or more data buses 22, 26 and 44 of information handling system 100 for activity. As mentioned above, CPU 12 typically may not enter into a reduced power state, e.g., a C-state, if there is activity on the one or more data buses 22, 26 and 44. Consequently, if there is activity on the one or more data buses 22, 26 and 44 detected at 106, method 100 preferably loops to await a period of data bus inactivity. However, if at 106 there is no activity detected on the one or more data buses 22, 26 and 44, method 100 preferably proceeds to 108.

Upon detecting a period of inactivity on the one or more data buses 22, 26 and 44 at 106, method 100 preferably determines whether there are any activities or transactions pending in the one or more information handling system 10 components coupled thereto at 108. For example, one or more information handling system 10 components may have received a transaction the component, device or process was to submit for processing upon a quieting or cessation of activities on the one or more buses 22, 26 and 44, e.g., communication controller 58 may have received one or more ACK (acknowledgement) or NAK (negative acknowledgement) packets from communication network 60.

If at 108 it is determined there are no activities or transactions pending for processing, method 100 preferably proceeds to 118 of FIG. 3. However, if at 108 it is determined that there exists one or more pending activities or transactions in one or more information handling system 10 components, devices or processes, method 100 preferably proceeds to 110.

At 110, a variety of implementations are contemplated whereby method 100 may evaluate the urgency or need for substantially immediate processing of the one or more pending activities or transactions, i.e., the need for processing a pending transaction before permitting one or more information handling system 10 devices to enter a reduced power state as opposed to processing the pending activity after passage of a reduced power state period.

For example, in one embodiment, at 110 method 100 may provide for a determination as to whether one or more of the pending activities should be completed to fulfill the needs of a currently running process. In another embodiment, method 100 may provide for the analysis of the pending transactions or activities to determine whether any of the transactions or activities are priority activities or transactions needing substantially immediate attention. Other embodiments of decision making may be employed at 110 without departing from the spirit and scope of the present disclosure.

If at 110 it is determined that one or more transactions should be processed substantially immediately, e.g., the one or more transactions cannot be held until after a reduced power state time interval, method 100 preferably proceeds to 112. At 112, the one or more transactions identified for substantially immediate processing are preferably processed in accordance with their associated component or process on information handling system 10. If, however, it is determined at 110 that the one or more activities or transactions pending in the one or more components of information handling system 10 may be held for processing, method 100 preferably proceeds to 114.

At 114, the one or more processes having one or more pending activities or transaction are preferably paused or halted for a selected time period, as discussed in greater detail below. Upon pausing or halting the one or more pending transactions or activities at 114, method 100 preferably proceeds to 116.

At 116, one or more components of information handling system 10 coupled to one or more of data buses 22, 26 and 44 are preferably instructed, configured or otherwise directed to enter into a buffering state. For example, in effort to permit the one or more components of information handling system 10 to enter a reduced power state for a selected period of time, communication controller 58 may be configured such that it maintains a link with communication network 60. As a result, any packets transmitted from communication network 60 to information handling system 10 through communication controller 58 are preferably received by communication controller 58 and buffered in a memory operably coupled to communication controller. Such a buffer or memory may be integrated into communication controller 58, communicatively coupled to communication controller 58 or an existing buffer 88 on communication controller 58 may be expanded to give the existing buffer 88 greater capacity. Once the necessary device or components are set to buffer any activity received during the reduced power state, method 100 preferably proceeds to 118 of FIG. 3.

Referring now to FIG. 3, a continuation of method 100 from FIG. 2 is shown, according to teachings of the present disclosure. At 118, method 100 preferably enables one or more of the components of information handling system 10 to enter into a reduced power state. In one embodiment, one or more additional processes running on information handling system 10 may control the entry of components into a reduced power state, e.g., the C-states. For example, CPU 12 may have one more hardwired or software solutions configured to recognize that data buses 22, 26 and 44 are quiet or inactive and, therefore, that CPU 12 may enter into a reduced power state such as a C-3 state. Alternatively, or in addition, power management chip set 74 and/or power management microcontroller 64 may facilitate the entrance of one or more components of information handling system 10 into a reduced power state. Additional configurations regarding the manner in which the one or more components of information handling system 10 enter into a reduced power state are contemplated within teachings of the present disclosure. Upon entrance of one or more components into a reduced power state, method 100 preferably proceeds to 120.

The longer a component is able to stay in a reduced power state, the greater the power savings to a fixed power supply such as battery 62. As such, one advantage of the present disclosure is its pursuit of maximizing the time one or more information handling system 10 components may remain in a reduced power state while minimizing any adverse effects observable by the user. Therefore, in one embodiment, method 100 preferably provides for maintaining inactivity on the one or more data buses 22, 26 and 44 for minimum blocks of time, e.g., method 100 may attempt to keep host-unit or CPU 12 in a C-3 power state for a minimum of one-hundred-twenty-five microseconds (125 µs), one-hundred-forty microseconds (140 µs), one-hundred-eighty microseconds (180 µs), as well as other intervals.

At 120, method 100 preferably pursues the maintenance of a reduced power state for one or more components of information handling system 10 for a minimum time period (X), e.g., one-hundred-twenty-five microseconds (125 µs), one-hundred-forty microseconds (140 µs), one-hundred-eighty microseconds (180 µs), as well as other intervals. As such, at 120, method 120 preferably determines whether time period (X) has passed since the one or more components entered a reduced power state. If at 120 it is determined than time period (X) has elapsed, method 100 preferably proceeds to 122.

At 122, method 100 preferably provides for the emergence of the one or more components from their reduced power state. Subsequently, method 100 may also provide for the reactivation of any components that halted or paused their processing of data as described at 114 above. Upon emergence from their reduced power state and upon reactivation, the one or more components may begin processing any pending activities remaining in a buffer or memory associated with the emerge and reactivated component as well as any activities buffered during time interval(X). Following emergence and reactivation at 122, method 100 preferably returns to 104 for processing in accordance with method 100 as described above.

In another embodiment, prior to progressing from 120 to 122, method 100 may interrogate one or more aspects of information handling system 10. For example, prior to progressing to 122, method 100 may determine whether any of the activities halted or paused or any of the activities buffered during time interval (X) need be substantially immediately processed. If it is determined that the existing activities needn't be currently processed, method 100 may provide for the maintenance of quiet or inactivity on data buses 22, 26 and 44 such that the one or more components may remain in their reduced power state for an additional time period (X) or for some other time period. A determination that may aid in whether or not components of information handling system 10 should remain in a reduced power state may include a determination as to whether the user is likely to notice the unavailability of the reduced power components. Other implementations of the transition between 120 and 122 are considered within the spirit, scope and teachings of the present disclosure.

Alternatively, if at 120 it is determined that time period (X) has not elapsed since the one or more components entered a reduced power state, method 100 preferably proceeds to 124.

At 124, a data loss safety measure may be implemented. In one embodiment of method 100, a check may be made during a period of reduced power of a buffer or memory associated with the one or more reduced power state components. If one or more buffers or memories are at risk for a data overflow, or other data loss, method 100 preferably proceeds to 126.

At 126, one or more of the reduced power state components may be emerged from their reduced power state. In addition, one or more components whose processing was halted or paused at 114 may also be reactivated. Upon emergence or reactivation at 126, all or a portion of the pending or buffered activities or transactions may be processed by their respective components or devices. Following emergence and reactivation at 126, method 100 preferably returns to 104 for processing in accordance with method 100 as described above.

If at 124, however, it is determined that there are no buffers currently at risk for overflow or data loss, method 100 preferably proceeds to 128.

At 128, the data received during time period (X) may be parsed to identify any priority data. Depending on the priority assigned, upon detection of one or more priority activities or transactions at 128, method 100 preferably proceeds to 130. For example, priority transactions may include critical system information transmitted from communication network 60 to communication controller 58 which should be substantially immediately processed.

Upon identification of any priority information, method 100 may emerge one or more of the reduced power state components such that the priority data may be processed at 130. Also at 130, method 100 may provide for the reactivation of one or more other halted or paused components at 114, as described above. Following emergence and reactivation at 130, method 100 preferably returns to 104 for processing in accordance with method 100 as described above.

In an alternate implementation, method 100 may be configured to cooperate with communication protocols that use packet priority schemes, e.g., IEEE 802.3p and 802.3q. In such systems, packets typically flow at the rate defined by their respective systems and do not use packet classes as described above. Modifying method 100 for such communication systems will allow further optimization of priority traffic and minimizes the detrimental impact of low priority packets. In still another implementation, teachings of the present disclosure may be modified to incorporate scaling based on class level in accordance with next generation communication technology.

If at 128 no priority information, transactions or activities are identified, method 100 preferably returns to 120 for a determination as to whether time period (X) has elapsed and for processing in accordance with method 100 as described above.

Operating an information handling system 10 in accordance with teachings of the present disclosure provides a variety of advantages. For example, by maintaining one or more information handling system 10 components in a reduced power state for relatively substantial periods of time, portable information handling systems may be made to operate for longer periods of time off of a single battery 62 charge. As discussed herein, battery life gains suggested by the present disclosure may be obtained without adversely affecting the user experience. By keeping one or more components in a reduced power state for as little as one-hundred-twenty to one-hundred-eighty microseconds (120-180 µs), significant gains in battery life may be achieved generally without user awareness of such component rest periods.

Figure 4:
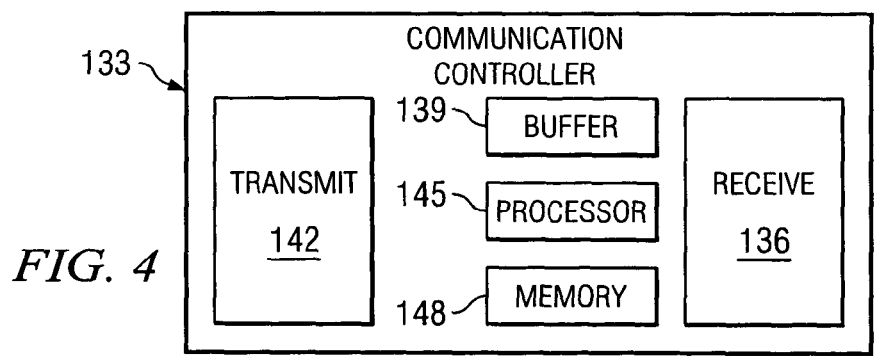
FIG. 4 is a block diagram depicting an embodiment of a communication controller incorporating teachings of the present disclosure.

Referring now to FIG. 4, a communication controller incorporating teachings of the present disclosure is shown. Communication controller 133 may be employed in a variety of areas of information handling system 10. For example, communication controller 133 may be employed between information handling system 10 and communication network 60. In other embodiments, communication controller 133 may be employed between one or more components of information handling system 10, between one or more external components and information handling system 10, as well as elsewhere in association with information handling system 10.

The communication capabilities of communication controller 133 may also be varied. In one embodiment, communication controller 133 may be a wired Ethernet communication controller. In another embodiment, communication controller may be a wireless communications device, e.g., IEEE 802.11a/b/g/h/etc. or other wireless protocol compatible. In a further embodiment, as mentioned above, communication controller 133 may be adapted to communicate with non-network components of or associated with information handling system 10.

As illustrated in FIG. 4, communication controller 133 may include receiver 136, buffer or memory 139, and transmitter 142. In a further embodiment, communication controller 133 may include processor 145 and instruction memory 148. Other communication controller designs may be deduced in light of the teachings of the present disclosure.

Receiver 136 of communication controller 133 is preferably operable to receive data transmissions from one or more sources such as communication network 60, one or more of data buses 22, 26 and 44, as well as from other sources. Similarly, transmitter 142 is preferably operable to communicate data via one or more sources such as communication network 60, one or more of data buses 22, 26 and 44, as well as on other sources. Receiver 136 and transmitter 142 may also be combined to form a transceiver.

As illustrated in FIG. 4, communication controller 133 preferably includes buffer 139. In an alternate embodiment, buffer 139 may be operably coupled to communication controller 133.

Typically, buffers range in size from two kilobytes (2 kb) to one hundred twenty eight kilobytes (128 kb) and may be implemented as smaller or larger versions. The typical lower end of packet size is sixty four (64) bytes, e.g., ACK (acknowledge) and NACK (negative acknowledge) packets are typically sixty four kilobytes (64 kb). According to the present disclosure, method 100 may be utilized with a buffer 139 capable of holding more than one sixty four (64) byte packet. However, provision of a larger buffer 139 will permit information handling system 10 to queue more transactions which, in turn, will permit information handling system 10 to remain in a reduced power state for longer periods of time which, in turn, enhances the power savings features of the present disclosure.

As mentioned above, buffer 139 is preferably operable to hold a not insignificant amount of data. For example, many modern communication controllers include a ring buffer. In such modern ring buffers, an incoming data packet, for example, is typically received into the buffer where processing of the data packet begins. These typical data buffers are generally sized such that they may contain a single data packet which must be immediately processed or data is put at risk for loss. As such, buffer 139 is preferably operable to store data in excess of one hundred twenty-eight kilobytes (128 kb).

Another characteristic of typical communication controllers is that their buffers or memory devices are FIFO (first in—first out) oriented. In contrast, the buffer included in communication controller 133 is preferably capable of being randomly accessed. As discussed above, one embodiment of method 100 includes the capability to parse received or buffered data to identify priority data. To enable such priority data to be pulled for processing before non-priority data, it is desirable to have a randomly accessible buffer associated with communication controller 133.

Processor 145 and instruction memory 148 may be included on communication controller such that one or more operations of method 100 may be effected by communication controller 133. For example, processor 145 and memory 148 may be adapted to determine whether there is activity on data buses 22, 26 and 44, to monitor the passage of time interval (T) or (X), as well as perform other functions.

Alternative embodiments of the present disclosure include computer-usable media encoding logic such as computer instructions for performing the operations of method 100. Such computer-usable media may include, without limitation, storage media such as floppy disks, hard disks, CD-ROMs, read-only memory, and random access memory; as well as communications media such as wires, optical fibers, microwaves, radio waves, and other electromagnetic or optical carriers. The control logic may also be referred to as a program product.

Although the disclosed embodiments have been described in detail, it should be understood that various changes, substitutions and alterations can be made to the embodiments without departing from their spirit and scope.

What is claimed is:

1. A method for conserving power in an information handling system, comprising:

while a host unit is in a normal power state, evaluating activity criteria from time to time, wherein said activity criteria are indicative of activity on a bus of the host unit;

evaluating said activity criteria to determine whether one or more pending activities should be completed to fulfill the needs of a currently running process;

responsive to determining the one or more pending activities should be completed, maintaining the host unit in the normal power state until the one or more pending activities is completed;

responsive to said activity criteria indicating both a lack of current bus activity and a lack of the one or more pending activities that should be completed, transitioning the host unit to a reduced power state;

responsive to receiving data by a communication controller while said host unit is in said reduced power state, maintaining the data in a buffer associated with the communication controller; and releasing the data from the buffer for processing responsive to the host unit transitioning from the reduced power state to the normal power state.

2. The method of claim 1, further comprising: while the host unit is in the reduced power state, evaluating buffered data criteria from time to time, wherein said buffered data criteria are indicative of a volume or priority of said data in said buffer;

responsive to said buffered data criteria indicating said data in said buffer has a predetermined priority or indicating a risk of data loss, transitioning the host unit to the normal power state, and releasing the data from the buffer for processing.

3. The method of claim 2, further comprising determining whether the bus of the host unit is active between releases of the data.

4. The method of claim 1, further comprising:
releasing the data for processing during a first fixed time interval; and
holding the data for a second fixed time interval.

5. The method of claim 4, further comprising varying the selected intervals in accordance with data volumes received by the communication controller.

6. The method of claim 1, further comprising monitoring buffer data volume to identify potential buffer data overflows.

7. The method of claim 6, further comprising emerging the host unit from the reduced power state in response to the identification of a potential buffer data overflow.

8. The method of claim 1, further comprising:
parsing received data to identify priority data; and
queuing the priority data for priority processing.

9. The method of claim 8, further comprising releasing the priority data from the buffer for substantially immediate processing.

10. A method for reducing power consumption in an information handling system, comprising:
evaluating activity criteria indicative of activity on one or more data buses coupled to a host unit of the information handling system to determine whether one or more pending activities should be completed to fulfill the needs of a process currently running on the host unit;
responsive to determining that the one or more pending activities should be completed, maintaining the one or more data buses in normal state until the one or more pending activities is completed;
quieting the one or more data buses;
migrating the host unit to a reduced power state upon quieting the one or more data buses;
maintaining the host unit in the reduced power state and the one or more data buses quiet for a selected period of time; and
resuming operation of the information handling system in accordance with a user selected operating mode after the selected period of time has elapsed.

11. The method of claim 10, further comprising buffering data received during the reduced power state period by an information handling system communication controller.

12. The method of claim 11, further comprising monitoring the information handling system communication controller for potential data overflow resulting from buffering the received data.

13. The method of claim 11, further comprising identifying buffered packets for priority processing upon resuming operation of the information handling system in accordance with the user selected operating mode.

14. An information handling system capable of existing in a reduced power state and a normal power state, comprising:
a host unit;
a data bus operably coupled to the host unit;
a communication controller operably coupled to the data bus and the host unit, the communication controller having a memory and operable to receive a volume of data;
the information handling system being enabled, while the host unit is in the normal power state, to evaluate activity criteria from time to time, wherein said activity criteria are indicative of activity on the data bus;
the information handling system being further enabled to evaluate said activity criteria to determine whether one or more pending activities should be completed to fulfill the needs of a currently running process;
the information handling system being further enabled, responsive to determining the one or more pending activities should be completed, to maintain the host unit in the normal power state until the one or more pending activities is completed;
the information handling system being further enabled, responsive to said activity criteria indicating both a lack of current bus activity and a lack of the one or more pending activities that should be completed, to transition the host unit to the reduced power state; and
the communication controller being operable to maintain received data in said memory while said host unit is in said reduced power state.

15. The system of claim 14, further comprising the communication controller operable to delay the release of the data in anticipation of transition of the host unit to the reduced power state.

16. The system of claim 14, further comprising the communication controller operable to parse the data received to identify priority data and release the priority data for processing whether the host unit is in the reduced power state or the normal power state.

17. The system of claim 14, further comprising the communication controller operable to influence time spent by the host unit in the normal power state and the reduced power state by varying its release of the data in accordance with at least one characteristic of data flow.

18. The system of claim 14, further comprising:
a first time interval associated with the reduced power state of the host unit;
a second time interval associated with the normal power state of the host unit; and
the communication controller operable to adapt its holding of the received data to correspond to the first time interval and its release of the data to correspond to the second time interval.

19. The system of claim 14, further comprising the communication controller operable to monitor the memory for data overflow and release the data from memory for processing in response to detection of data loss.

20. The system of claim 14, further comprising the communication controller operable to determine host unit operation status by monitoring activity on the data bus.

* * * * *